United States Patent
Sadd et al.

(12)

(10) Patent No.: US 6,307,782 B1
(45) Date of Patent: Oct. 23, 2001

(54) PROCESS FOR OPERATING A SEMICONDUCTOR DEVICE

(75) Inventors: Michael Alan Sadd, Austin; Bruce E. White, Round Rock; Ramachandran Muralidhar, Austin, all of TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/542,017

(22) Filed: Apr. 3, 2000

(51) Int. Cl.⁷ .................................................. G11C 13/07
(52) U.S. Cl. ................................. 365/185.18; 365/189.09
(58) Field of Search ......................... 365/185.18, 189.09, 365/230.01, 189.01

(56) References Cited

U.S. PATENT DOCUMENTS

| 5,233,562 | 8/1993 | Ong et al. ............................. 365/218 |
| 5,457,652 | * 10/1995 | Brahmbhatt ...................... 365/189.01 |
| 5,621,233 | 4/1997 | Sharma et al. ........................ 257/316 |

FOREIGN PATENT DOCUMENTS 192486    7/1995   (JP) .

OTHER PUBLICATIONS

Kim et al., "Room Temperature Single Electron Effects in Si Quantum Dot Memory with Oxide–Nitride Tunneling Dielectrics," IEEE, 4 pgs. (1998).

Yamada et al., "A Self–Convergence Erasing Scheme for a Simple Stacked Gate Flash EEPROM," IEEE, pp. 11.4.1–11.4.4 (1991).

Shum et al.; U.S. application No. 09/342,725 filed Jun. 29, 1999.

White et al.; U.S. application No. 09/495,354 filed Feb. 1, 2000.

* cited by examiner

Primary Examiner—Terrell W. Fears
(74) Attorney, Agent, or Firm—George R. Meyer; Patricia S. Goddard

(57) ABSTRACT

Programmable cells (22, 24, 26, 28) may have discontinuous storage elements (228, 248, 268, 288) as opposed to a continuous floating gate. Each cell further includes first and second current carry electrodes (222, 226, 242, 246, 262, 266, 282, 286) and a control gate electrode (224, 244, 264, 284). In one embodiment, potentials for programming can be selected to program a programmable cell relatively quickly without the need for relatively high potentials. Alternatively, programming can be achieved by flowing current in one direction and then in the opposite direction. In some embodiments, time-variant signals can used during an operation. Embodiments of the present invention can be used with different types of programmable cells including those used in memory arrays and in field programmable gate arrays.

20 Claims, 2 Drawing Sheets

PROCESS FOR OPERATING A SEMICONDUCTOR DEVICE

RELATED APPLICATION

This is related to U.S. patent application Ser. No. 09/342,725, entitled "Semiconductor Device and a Method of Operating the Same" filed Jun. 29, 1999 now abandoned, and U.S. patent application Ser. No. 09/495,354, entitled "Process for Operating a Semiconductor Device" filed Feb. 1, 2000 now U.S. Pat. No. 6,172,905. Both applications are assigned to the current assignee hereof and are incorporated herein by reference.

FIELD OF THE INVENTION

The invention relates in general to semiconductor devices and more particularly to processes for operating programmable cells within semiconductor devices.

RELATED ART

Floating gate memory cells are used as nonvolatile memory cells in many applications. Due to scaling requirements, including thinning of tunnel dielectric layers, the use of conventional floating gate memories may prove to be impossible from a practical standpoint. Because of point defects within the tunnel dielectric layer, unintended electrical shorts or leakage paths between the floating gate and substrate may form and cause undesirable electrical characteristics of the memory cell. Operating the floating gate memory cells typically is performed by programming, erasing, and reading the memory cells. Programming is typically performed by hot carrier injection or Fowler-Nordheim tunneling. In the case of hot electron injection, typically, the source is grounded, the drain region placed at potential of approximately 5–7 volts, and the control gate for the memory cell is placed at a potential of approximately 6–8 volts for a time of approximately 10 microseconds. Usually, the drain current during hot electron injection is greater than approximately 500 microamperes. Obviously, this depends on the geometries of the memory cell. For Fowler-Nordheim tunneling, typically, the source, drain, and substrate are grounded, and the control gate is taken to a potential in a range of approximately 15–20 volts, with a corresponding programming time of approximately 10 milliseconds.

Nanocrystals are being investigated as a replacement to continuous floating gates in nonvolatile memories. These are discontinuous storage elements that overlie a tunnel dielectric. The nanocrystals are not programmed using hot electron injection using the conventional method previously described because too much of the charge would be concentrated in the storage elements closest to the drain. Therefore, direct tunneling of electrons from the conduction band of the substrate to the conduction band of the nanocrystal or of holes from the valence band of the substrate to the valence band of the nanocrystal is typically the process used to program and erase the nanocrystal memory elements.

FIG. 1 includes an illustration of drain current versus drain voltage for an ideal metal oxide semiconductor field-effect transistor (MOSFET) with a constant gate potential. The source and the substrate or well region are grounded. The linear region 12 generally reflects that the current-voltage (I–V) characteristics are linear through that region. The other region, which is the saturation region 14, is where increasing drain voltage does not significantly increase the drain current. As will be described later, the significance between the linear region 12 and the saturation region 14 will become apparent as operation of a memory cell is described. It should be noted at this point that many of the programming mechanisms used, particularly in hot carrier injection, operate the drain voltage such that the transistor is operating in the saturation region 14.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Programmable cells may have discontinuous storage elements as opposed to a continuous floating gate. Each cell further includes first and second current carrying electrodes and a control gate electrode. In one embodiment, potentials for programming can be selected to program a memory cell relatively quickly without the need for relatively high potentials. Alternatively, programming can be achieved by flowing channel current in one direction and then in the opposite direction. In some embodiments, time-variant signals can used during an operation. Embodiments of the present invention can be used with different types of programmable cells including those used in memory arrays and in field programmable gate arrays. The present invention is defined by the claims and is better understood after reading the description of some illustrative embodiments that follow.

Before continuing, a few terms are defined to avoid confusion. As used hereinafter, "programming" is an electrical altering of charge within the storage element(s) of a nonvolatile memory (NVM) cell. "Binary programming" is performed so that the threshold voltage ($V_{th}$) of the NVM cell is high enough that the NVM cell is capable of being determined to be programmed by a sense amplifier. Binary programming may also be called "high-level programming" and is a more traditional meaning of programming that is usually associated with programming of NVM cells. "Repairing" or "low-level programming" is a type of programming that is used to alter the charge within a storage element(s) of an over-erased cell so that the $V_{th}$ of that cell is above a predetermined level. Typically, the $V_{th}$ for repairing is lower than that used for binary programming.

As used herein, a dedicated source bit line or a dedicated drain bit line means that a bit line is only connected to one row or one column of memory cells. This should be contrasted with a shared source bit line or a shared drain bit line in which a single source bit line or drain bit line is shared by at least two columns or at least two rows of memory cells. A substrate region can include the semiconductor device substrate (e.g., a monocrystalline silicon wafer or the like) or a well region within the semiconductor device substrate. Lateral dimensions are dimensions of a memory cell as seen from a top view of the memory cell. Examples include channel width, channel length, gate width, contact spacing, or the like.

Figure 2:
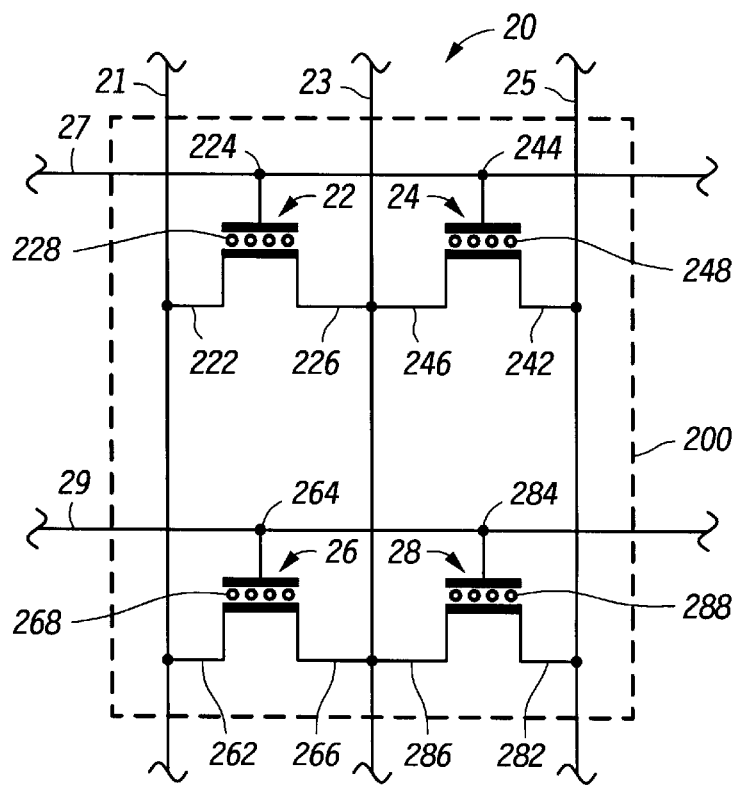
FIG. 2 includes an illustration of a circuit schematic of four memory cells within a portion of a memory array.

FIG. 2 includes an illustration of a circuit schematic of a portion of a memory array 20 within a semiconductor device. All the memory array 20 lies within a well region 200. The memory array includes memory cells 22, 24, 26 and 28. Each of the memory cells includes current carrying electrodes, which can be a source region (222, 242, 262, 282) or a drain region (226, 246, 266, 286), a control gate electrode (224, 244, 264, 284), and discontinuous storage elements (228, 248, 268, 288). At least part of the memory cells (typically the current carrying electrodes) lie within the well region (substrate region) 200. In this particular embodiment, the discontinuous storage elements are nanocrystals, which are typically small islands of discontinuous semiconductor material. Examples of the materials include silicon, germanium, silicon germanium, silicon germanium carbide, gallium arsenide, or the like. In this particular embodiment, each of the discontinuous storage elements is undoped. In an alternate embodiment, the discontinuous storage elements may be doped.

The memory array 20 also includes the source bit line 21, a drain bit line 23, another source bit line 25, a first word line 27, and a second word line 29. Portions of the word lines 27 and 29 are control gates (224, 244, 264, 284) for the memory cells (22, 24, 26, 28). For memory cells 22 and 26, the source bit line 21 is electrically connected to the source regions 222 and 262, and the drain bit line 23 is electrically connected to the drain regions 226 and 266. For memory cells 24 and 28, the drain bit line 23 is electrically connected to the drain regions 246 and 286, and the source bit line 25 is electrically connected to the source regions 242 and 282. The memory cells are connected as illustrated in FIG. 2. In this memory array, the source and drain bit lines are shared between two immediately adjacent columns of memory cells.

The memory array 20 is programmed such that the memory cell 22 is selected and becomes programmed without disturbing the data within memory cells 24, 26, and 28. In this particular embodiment, the source bit line 21 and all other bit lines (not shown in FIG. 2) to the left of source bit line 21 are taken to a potential of approximately $V_{SS}$, which is at approximately 0 volts. The drain bit line 23, source bit line 25, and all other bit lines (not shown in FIG. 2) to the right of source bit line 25 are taken to a potential of approximately $V_{DD}$. In this particular embodiment of the present invention, $V_{DD}$ typically does not exceed approximately 2.2 volts. In future generations, the potential $V_{DD}$ is expected to decrease to approximately 1.8 volts, 0.9 volts, or possibly lower. Further, the second word line 29 and the well region 200 are at a potential of approximately $V_{SS}$. The first word line 27 is at approximately $V_{pp}$, which is approximately 2–5 times higher than $V_{DD}$. All other bit lines (not shown in FIG. 2) to the left of source bit line 21 are likewise grounded.

In this particular embodiment, the ranges of the potentials are expected to be as follows: the drain bit line 23 can be at a potential of approximately 0–2 volts times the width (in microns) of the gate electrode 224 divided by 0.1 microns. For example, if the width of gate electrode 224 is approximately 0.15 microns, the potential on the shared drain/source bit line 23 can be as high as approximately 3 volts. Usually, the width of the control gate, which is an example of a lateral dimension, is typically no greater than approximately 0.2 microns. The potential difference between the bit lines for the selected memory cell is typically no greater than approximately 4 volts. For the first word line 27, the potential is typically in a range of approximately 2–8 volts. In one specific embodiment, the source bit line 21 is at a potential of approximately 0 volts and the first word line 27 is at a potential of approximately 4 volts. During this operation, the electron velocity is higher near the drain region 226 of the memory cell 22. Therefore, storage elements 228 closer to the drain region 226 are charged to a larger extent than those near the source region 222.

A second portion of the programming act reverses the current flow and is performed to charge the storage elements 228 closer to the source region 222. In this embodiment, the potentials on the bits lines are switched. The drain bit line 23, the source bit line 25, the second word line 29, and the well region 200 are at approximately 0 volts. The source bit line 21 is at approximately $V_{DD}$. The first word line 27 remains at approximately $V_{pp}$. In this manner, only memory cell 22 has been programmed.

Multiple memory cells can be programmed at the same time, if desired. For example, a row programming ("page write") may be performed along the first word line 27. The potential difference within each memory cell to be programmed should have a potential difference between the source and drain that is significantly greater than 0 volts. For those memory cells that are not to be programmed, the potential difference between its source and drain regions should be approximately 0 volts. In this manner, the programmed cells are programmed and the unprogrammed cells are remain unaffected. Likewise, the memory cells on adjacent rows corresponding to the other word lines are not significantly affected by this operation. Programming operations typically are performed with a programming time of no greater than approximately 100 microseconds and may be as short as approximately 10 nanoseconds, regardless whether one or multiple memory cells are programmed.

Figure 1:
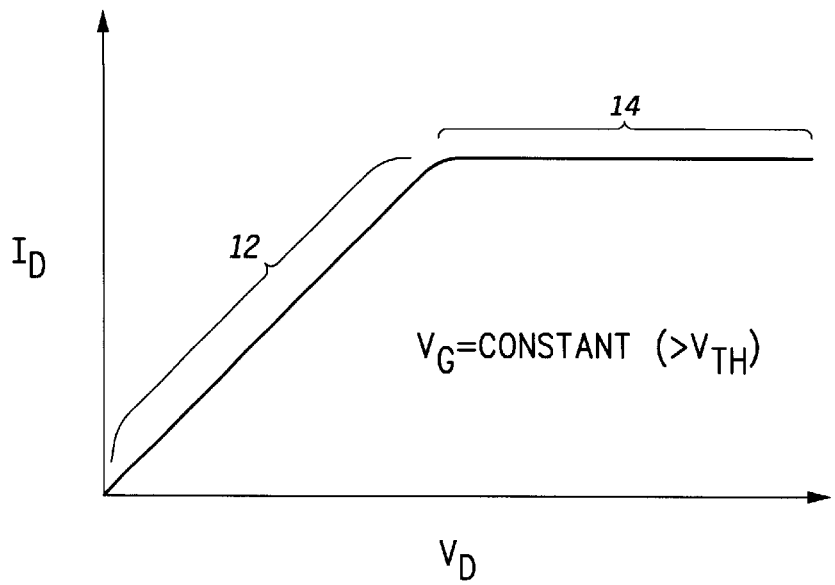
FIG. 1 includes an illustration of a plot illustrating drain current-voltage characteristics for an ideal MOSFET (prior art)

Some relationships between the potentials as used in programming the memory cells 22 are worth noting. For example, the potential difference between the source and drain region is such that the I–V characteristics are within the substantially linear region for the selected memory cell during programming. For example, referring to FIG. 1, the potential between the source and drain regions is at a point that lies within the linear region 12 as opposed to the saturated region 14, which is typically used for hot carrier injection. Also, the potential difference between the source region and the well region has an absolute value that is no greater than approximately 0.5 volts. In this particular embodiment, the potential difference is substantially zero volts. The change in the threshold voltage for binary programming is typically no greater than approximately 2 volts. Because relatively lower potentials are used, the higher potentials seen with conventional binary programming are not necessary. For many embodiments, the change in the threshold voltage is typically in a range of approximately 0.5 to 1 volt.

The absolute values for all the potential differences between the various elements are no greater than approximately 5 volts. In this particular embodiment, the potential difference between the word line 27 and the drain bit line 23 is approximately 4 volts. This represents the highest value as used in the particular embodiment disclosed. The actual potentials can be shifted. For example, all potentials could be increased by 5 volts, decreased by 5 volts, or any constant factor in between or possibly even others.

The erasing and reading of the memory cell can be performed using conventional methods. Because the nanocrystal memory cells typically operate at lower potentials, the erasing potentials are lower than those used for conventional floating gate memory cells. For example, the source region may electrically float (a high impedance state) or be at approximately 0 volts. Likewise, the drain region and well region is at approximately 0 volts. The control gate is at approximately −4 volts. Clearly, this one particular embodiment is not meant to limit but just to illustrate one exemplary set of erasing conditions. The reading is typically performed by placing the source region and the well region at approximately 0 volts and the drain region and the control gate at approximately the $V_{DD}$ potential.

This particular embodiment is less susceptible to failures after many cycles compared to a floating gate memory. For example, floating gate memories typically can withstand up to one million cycles. The number of cycles that can be used with a nanocrystal memory cell as described can easily exceed at least approximately $10^7$ cycles and could well exceed approximately $10^9$ cycles. As used herein, a cycle is one event of programming followed by one event of erasing.

Figure 3:
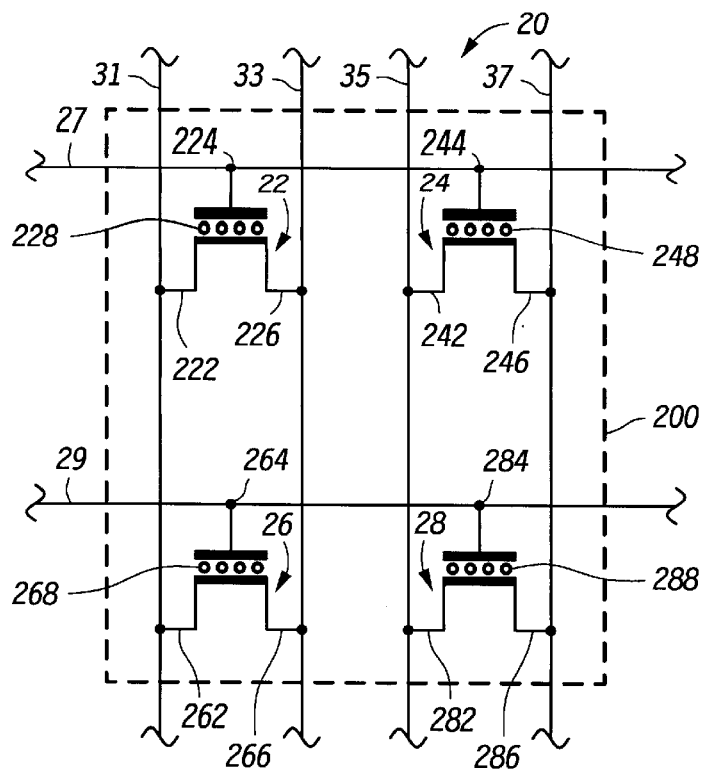
FIGS. 3 and 4 include illustrations of circuit schematics of alternative embodiments of the memory array.
Figure 4:
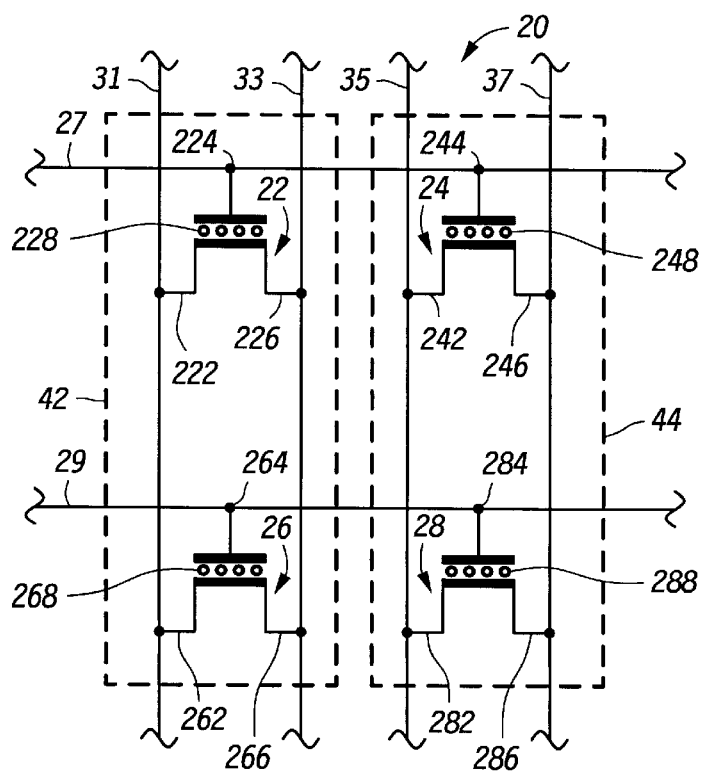

FIGS. 3 and 4 include alternative embodiments of the present invention. For example, in FIG. 3 dedicated source and drain and bit lines are used. For example, there is a first source bit line 31, a first drain bit line 33, a second source bit line 35, and a second drain bit line 37. The potentials used for programming and erasing memory cell 22 are shown in Table I below.

TABLE I (All potentials in volts)

| | SBL 31 | DBL 33 | SBL 35 | DBL 37 | WL 27 | WL 29 | WELL 200 |
|---|---|---|---|---|---|---|---|
| Program | 0 | $V_{DD}$ | 0 | 0 | $V_{PP}$ | 0 | 0 |
| Erase | $V_{PP}$ | $V_{PP}$ | $V_{PP}$ | $V_{PP}$ | 0 | 0 | $V_{PP}$ |

FIG. 4 includes an embodiment in which there are multiple well regions 42 and 44 oriented in columns, as opposed to a common well region. As illustrated in FIG. 4, the first source bit line 31, first drain bit line 33 are parallel to the length of the first well region 42. Likewise, the second source bit line 35, the second drain bit line 37 and the second well region 44 lie substantially parallel to one another. The programming potentials for writing memory cell 22 are illustrated as shown below in Table II.

TABLE II (All potentials in volts)

| | SBL 31 | DBL 33 | SBL 35 | DBL 37 | WL 27 | WL 29 | WELL 42 | WELL 44 |
|---|---|---|---|---|---|---|---|---|
| Program | $-V_{PP}/2$ | $-V_{PP}/2 + V_{DD}$ | 0 | 0 | $V_{PP}/2$ | 0 | $-V_{PP}/2$ | 0 |
| Erase | $V_{PP}/2$ | $V_{PP}/2$ | 0 | 0 | $-V_{PP}/2$ | 0 | $V_{PP}/2$ | 0 |

In still other embodiments, time-variant signals can be applied to any of the electrodes to a programmable cell during an operation, such as programming, erasing, or reading. As used herein, a time-variant signal is signal that does not have a substantially constant potential (i.e., direct current) during an operation. Examples of time-variant signals include sinusoidal, square-wave, or other signals that vary over time. Although not required, the signal typically can be characterised by a phase and frequency. The prior examples from Tables I and II use substantially constant potentials (not time-variant signals) during programming and erasing.

In one example from Table I, the source bit line 31 is at a potential of approximately $V_{DD}$, and the drain bit line 33 may carry a signal that varies from 0 to $2(V_{DD})$ during programming. In this manner, the potential of the drain region (current carrying electrode) 226 is sometimes higher than the potential of source (current carrying electrode) 222, and during other times, the potential of drain 226 is lower then the potential of source region 222. By using this time-variant signal, programming nanocrystals near the source region 222 and the drain region 226 can be performed with one operation.

Alternatively, time-variant signals can be applied to both the source region 222 and drain region 226. Typically, the time-variant signals applied to the source region 222 and the drain region 226 have substantially the same frequency and are out of phase from each other by least approximately 90 degrees. Ideally, the signals are approximately 180 degrees out of phase compared to each other. Programming time is minimized as the frequencies of the two signals are the same and the phases of the signals are out of phase by an amount other than 180 degrees. In this embodiment, the average value of the time variant signal is approximately 0 volts.

In still another embodiment, a time-variant signal can be applied to the control gate (control electrode) during programming. For example, word line 27 can have a signal that varies from $V_{PP}+0.25(V_{PP})$ to $V_{PP}-0.25(V_{PP})$. The varying signal can help band-to-band tunneling. In this embodiment, the average value of the time-variant signal is approximately $V_{PP}$.

Various combinations of the time-variant signals on the electrodes (source region 222, drain region 226, and control gate 224) may be used. Although specific values of the time-variant signals have been given, clearly, in other embodiments, other values are possible.

The embodiments of the present invention as described herein have many advantages over the prior art methods and memory cells. For example, the use of nanocrystals allows the scaling of the device to smaller dimensions and potentials. By using the unique set of operating potentials as described herein, the memory cell can be programmed approximately 10 to 1000 times faster than the same memory cells being programmed using direct tunneling without a drain bias. Also, it has the advantage that it does not have the drain current limitations or localized programming as seen with hot carrier injection. The drain current during programming is typically no greater than approximately 500 microamperes, and typically is less than 200 microamperes.

Although the invention has been described with two write operations, it is possible that only one of the two write operations is necessary to program the memory cells. Because all of the potentials used for operating the memory cell can be made less than approximately 5 volts, the problems seen with disturb whether it be write disturb, erase disturb, or read disturb, or also with junction breakdowns and other effects should not be seen. Although many of the embodiments have been described with respect to binary programming, the concepts should be extendible to repairing memory cells.

Although the invention has been described with respect to specific assignments of sources and drains, skilled artisans appreciate that assignments of sources and drains may be reversed. Further, the programming, erasing, and reading of memory cells within a memory array can be used other types of programmable cells, such as those in field programmable gate arrays, In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for operating a first programmable cell comprising:
   providing a first programmable cell, wherein the first programmable cell:
      includes a first current carrying electrode, a second current carrying electrode, and a control electrode; and
      a portion of the first programmable cell lies within a substrate region; and
   programming the first programmable cell including:
      placing the first current carrying electrode at a first potential;
      placing the second current carrying electrode at a second potential that is different from the first potential;
      placing the control electrode at a third potential that is different from the second potential; and
      placing the substrate region at a fourth potential, wherein:
         a first potential difference is an absolute value of a difference between the first and second potentials, wherein the first potential difference lies within a substantially linear region of an I–V plot for the first programmable cell; and
         a second potential difference is an absolute value of a difference between the second and fourth potentials and is no greater than approximately 0.5 V.

2. The process of claim 1, wherein the first programmable cell further comprises discontinuous storage elements.

3. The process of claim 1, wherein the first potential difference is no greater than approximately 4 volts.

4. The process of claim 1, wherein programming the first programmable cell is characterized as binary programming.

5. The process of claim 1, wherein programming the first programmable cell changes a threshold voltage no greater than approximately 2 volts.

6. A process for operating a first programmable cell comprising:
   providing a first programmable cell, wherein the first programmable cell:
      includes a first current carrying electrode, a second current carrying electrode, a control electrode, and discontinuous storage elements; and
      at least a portion of the first programmable cell lies within a substrate region; and
   programming the first programmable cell including:
      placing the first current carrying electrode at a first potential; and
      placing the second current carrying electrode at a second potential that is different from the first potential,
      wherein a first potential difference is an absolute value of a difference between the first and second potentials, and wherein the first potential difference lies within a substantially linear region of an I–V plot for the first programmable cell.

7. The process of claim 6, further comprising:
   placing the control electrode at a third potential;
   placing the substrate region at a fourth potential; and
   a second potential difference that is an absolute value of a difference between the second and fourth potentials, wherein the second potential difference is no greater than approximately 0.5 volt.

8. The process of claim 7, wherein the programming of the first programmable cell changes a threshold voltage no greater than approximately 2 volts.

9. The process of claim 6, wherein programming the first programmable cell is characterized as binary programming.

10. The process of claim 6, wherein:
    the control electrode has a first lateral dimension in microns; and
    the first potential difference is less than approximately 2 volts times the first lateral dimension divided by 0.1 microns.

11. The process of claim 10, wherein the first lateral dimension is no greater than approximately 0.2 microns.

12. A process for operating a programmable cell comprising:
    providing a programmable cell, wherein the programmable cell:
       includes a first current carrying electrode, a second current carrying electrode, and a control electrode; and
       at least a portion of the programmable cell lies within a substrate region; and
    programming the programmable cell including:
       biasing the control electrode;
       flowing a first set of carriers from the first current carrying electrode through at least a portion of the substrate region to the second current carrying electrode; and
       flowing a second set of carriers from the second current carrying electrode through at least a portion of the substrate region to the first current carrying electrode.

13. The process of claim 12, wherein the programmable cell further comprises a storage element that lies between the substrate region and the control electrode.

14. The process of claim 12, wherein a current through at least one of the first and second current carrying electrodes is no greater than approximately 500 microamperes.

15. A process for operating a programmable cell comprising:

providing a programmable cell having a first electrode, a second electrode, and a third electrode, wherein the first and second electrodes are current carrying electrodes and the third electrode is a control electrode;

performing an operation on the programmable cell including:

applying a first time-variant signal to the first electrode of the programmable cell which establishes a first time-variant potential on the first electrode, wherein a first potential difference is an absolute value of a difference between the first time-variant potential and a second potential on the second electrode, and wherein the first potential difference lies within a substantially linear region of an I–V plot for the programmable cell.

16. The process of claim 15, wherein the operation includes programming the programmable cell.

17. The process of claim 15, wherein:

the process further comprises applying a second time-variant signal to the second electrode which establishes a second time-variant potential on the second electrode; and performing the operation is performed while the first and second time-variant signals are applied to the first and second electrodes, respectively, and the first potential difference is an absolute value of a difference between the first time-variant signal and the second time-variant signal.

18. The process of claim 17, wherein the first and second time-variant signals are at least 90 degrees out of phase compared to each other.

19. The process of claim 17, wherein:

the process further comprises applying a third time-variant signal to the third electrode; and performing the operation is performed while the first, second and third time-variant signals are applied to the first, second, and third electrodes, respectively.

20. The process of claim 15, wherein the programmable cell further comprises discontinuous storage elements.

* * * * *